(12) United States Patent
Ponder et al.

(10) Patent No.: US 10,869,565 B2
(45) Date of Patent: Dec. 22, 2020

(54) PILLOW DEVICE

(71) Applicants: Donny Ponder, Hernando, MS (US);
Tatiana Ponder, Hernando, MS (US)

(72) Inventors: Donny Ponder, Hernando, MS (US);
Tatiana Ponder, Hernando, MS (US)

(*) Notice: Subject to any disclaimer, the term of this patent is extended or adjusted under 35 U.S.C. 154(b) by 346 days.

(21) Appl. No.: 15/888,033

(22) Filed: Feb. 4, 2018

(65) Prior Publication Data

US 2019/0239665 A1    Aug. 8, 2019

(51) Int. Cl.
*A47C 9/10* (2006.01)
*A47G 9/10* (2006.01)
*A47G 9/02* (2006.01)

(52) U.S. Cl.
CPC ............. *A47G 9/10* (2013.01); *A47G 9/0253* (2013.01); *A47G 2009/1018* (2013.01)

(58) Field of Classification Search
CPC ........................................................ A47G 9/10
USPC ............................................ 5/640, 644, 911
See application file for complete search history.

(56) References Cited

U.S. PATENT DOCUMENTS

| | | | | |
|---|---|---|---|---|
| 2,500,974 | A * | 3/1950 | Angert | A47G 9/10 5/645 |
| 6,047,425 | A * | 4/2000 | Khazaal | A47G 9/1027 5/640 |
| 6,334,227 | B1 * | 1/2002 | Larger | A47C 3/16 5/653 |
| 2007/0074349 | A1 * | 4/2007 | Green | A47C 15/004 5/653 |

* cited by examiner

*Primary Examiner* — Fredrick C Conley

(57) ABSTRACT

A pillow for a user may include a compressible resilient bottom support base; a top sack enclosing a distinct mix of foam fill particles; the top sack including sewn and un-sewn sections or internal baffles defining a pattern of channels or chambers for controlling movement of the distinct mix of foam fill particles; wherein the pattern of channels or chambers may generally resemble the shape of a plurality of baseball bats lined up together vertically side by side; the compressible resilient support base including a generally flat surface for receiving the top sack and defining a surface for the distinct mix of foam fill particles to travel over; wherein the sack enclosing the distinct mix of foam fill particles may be reset to an original state by holding the pillow vertically or by patting the top sides or back of the pillow.

20 Claims, 15 Drawing Sheets

PILLOW DEVICE

FIELD OF THE INVENTION

The present invention relates to pillows.

BACKGROUND

U.S. Pat. No. 7,461,424 describes a pillow that uses a mix of three sizes of foam pieces. Since the foam pieces are formed by feeding a foam block into a shredder, the shapes are random. Further, this patent misses overlaying a plurality of specifically sized foam pieces over a foam block for a different function.

U.S. Pat. No. 6,230,347 describes a wedged shaped pillow with a compliant overlay filled with down or fiberfill and a firm supporting core. This patent primarily focuses on graduated firmness within a wedge shape for preventing the down or fiberfill from avalanching down the wedge shape.

Patent Application 2013/0263377 describes a customizable pillow and bed mattress. This focuses on layers that are designed for the user to insert or remove to adjust to their preference. It indicates that memory foam and micro-beads may be used as fill materials (among a long list of other materials). It does not specify that they must be overlayed in a specific order or that a mix of specific sized beads be used.

Patent Application 2011/0239372 is for a pillow or crib mattress for infants that has a layer of fluid or air for totally absorbing and distributing the shape of an infant's head to prevent a certain deformity for the infant's head. It includes a top layer of incompressible beads.

U.S. Pat. No. 5,572,757 has 3 parallel elongated semi-circle chambers zipped to one another with various fill materials including foam and beads. One illustration shows randomly sized beads in one of the chambers.

Patent Application 2012/0079659 describes a pillow that has a layered foam insert with an outer shell. The distinguishing feature is the outer shell has a void in the middle for receiving the head of the user.

U.S. Pat. No. 5,778,470 is for a pillow where a top and bottom layer of memory foam are sealed together encapsulating two internal chambers filled with randomly sized polystyrene beads.

Patent Application 2016/0051431 is for a neck pillow with an unusual shape for helping sufferers of vertigo.

Patent Application 2016/0029821 is for a U-shaped travel neck pillow that has a foam receiving section for the neck and two elongated arms that are both filled with polystyrene beads. The foam receiving section for the neck is horizontally flat.

SUMMARY OF THE INVENTION

The Pillow of the present invention places the user's head in a naturally relaxed state by evenly distributing pressure, better absorbing the user's shape, reducing pressure on the back of the head and providing both firm and adaptive support. It has a top layer that is pliable and less resilient than a bottom layer that is substantially solid, highly resilient and compressible. The top and bottom layer may be attached one to another and disposed within a removable outer cover. The top layer is characterized by a volume of loose compressible resilient fill particles that easily travel within a sack/container. The volume of loose compressible resilient fill particles preferably comprises a specific mix of two distinct sizes of polystyrene beads. The sack/container comprises distinct chambers/channels, preferably formed by sewing distinct patterns into the sack, to channel and control travel of the volume of loose compressible resilient fill particles. The chambers/channels may form a pattern generally resembling the shape of a plurality of baseball bats lined up together vertically side by side. Internal baffles may also be used to form the distinct patterns. The sewn patterns may include lose internal threads or porous baffles to allow loft and less restricted movement of the volume of loose compressible resilient fill particles in defined areas. The bottom layer is characterized by a substantially solid compressible resilient block, preferably a generally rectangular block of memory foam ranging from 1.0" to 2.5" in loft and 2 to 5 pounds in density. The substantially solid compressible resilient block preferably defines a generally flat periphery to support travel of the volume of loose compressible resilient fill particles within the top layer. The volume of loose compressible resilient fill particles distributes throughout the chambers/channels of the top layer to adapt to the shape of the user. The top layer may also be reset to an original state by the user by holding the pillow vertically or by patting on the back or sides of the top of the pillow causing a majority of the volume of loose compressible resilient particles to substantially pool up in a main area. The removable outer cover may include areas of stretch fabric and other areas of non-stretch fabric to control how much the user's head sinks into the pillow.

DETAILED DESCRIPTION

Figure 1:
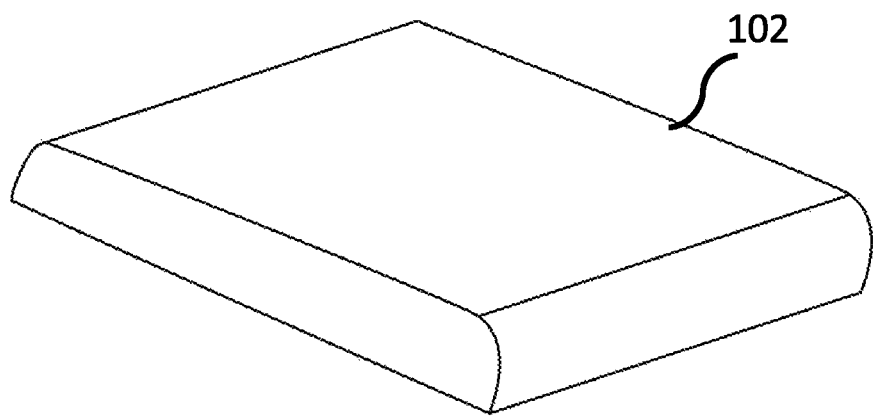
FIG. 1 illustrates a bottom base layer of the pillow of the present invention.

FIG. 1 illustrates a bottom base 102 which may be formed from foam material more particularly memory foam. Different densities of the bottom base 102 may be used to affect the firmness of the pillow 100. A less firm pillow 100 may use a 4 pound memory foam base while a firmer pillow 100 may use a 5 pound memory foam base. The bottom base 102 may be generally flat and rectangular and ranging between 1 inch to 2.5 inches in loft. The bottom base 102 may have curves such as a back bolster. The bottom base 102 may be enclosed in elastic average shell or outer covering having a zipper to remove and insert the bottom base 102.

Figure 2:
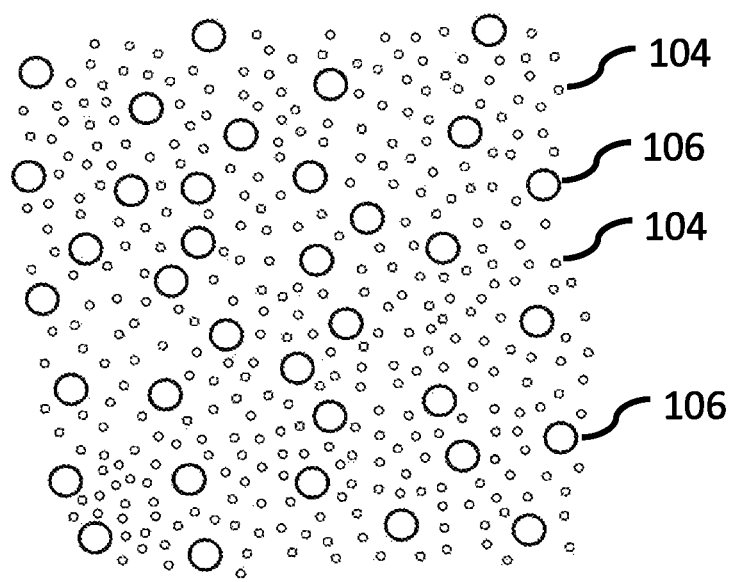
FIG. 2 illustrates at least two sizes of beads of the pillow of the present invention.

FIG. 2 illustrates the mixture of beads for the pillow 100. The beads may be a mixture of a plurality of small beads 104 and a plurality of large (larger) beads 106, and the beads 104, 106 may preferably be formed from polystyrene. The range of the small beads 104 may be between 0.01 mm and 2 mm in diameter which may be referred to as micro beads and the range of the large beads may be between 3 and 10 mm which may be referred to as bean bag fill. The range of the mix may be approximately 60% to 80% of the small beads 104, and the range of the mix may be 20% to 40% of the large beads 106. The large beads 106 provide bulk and control movement of the mix of the beads better within the pillow 100 while the small beads 104 fill empty spaces better and provide smoother support for the user. The small beads 104 alone tend to act like sand without having the influence of the larger beads 106 mixed in. Juxtaposing the bead mix on the foam's flat sheet provide a controlled area for the dispersion of the beads 104, 106 in the defined area in response to the user. Two sizes of shredded foam could be used, but the shredded foam does not move sufficiently freely as needed for the desired effect.

Figure 3:
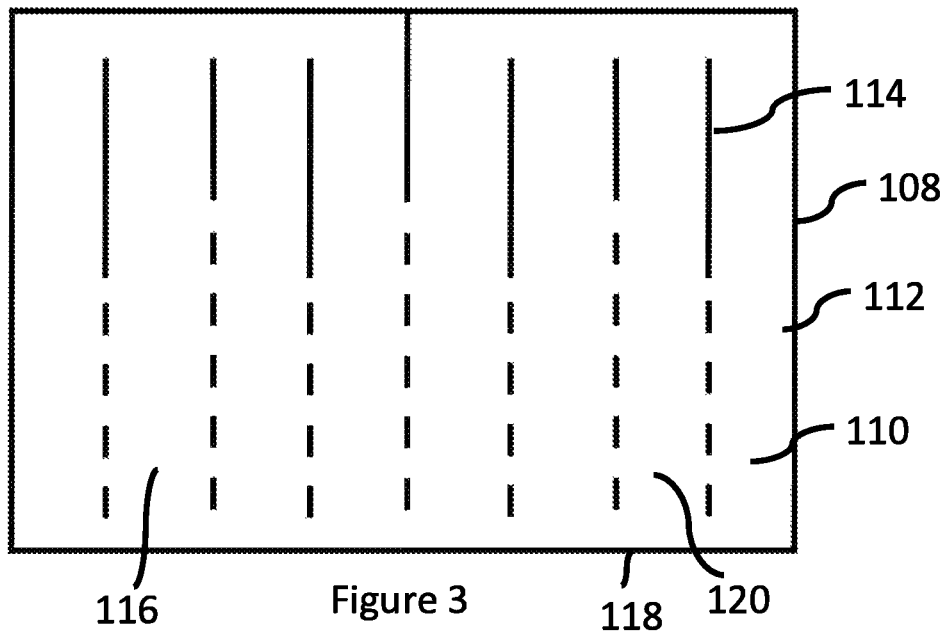
FIG. 3 illustrates the top layer of the pillow of the present invention.

FIG. 3 illustrates the top sheet 110 of the bead container 108 which may be opposed to a bottom sheet 118 which may be a sack having a bead cavity 112 which may be defined between the top sheet 110 and the bottom sheet 118 which may be filled with the small beads 104 and the large beads 106. The top sheet 110 and the bottom sheet may include sown sections 114 which may be shown as a solid or intermittent line where the top sheet 110 may be joined to the bottom sheet 118. Both the small beads 104 and the large beads 106 generally cannot cross through the sown sections 114, Between the sown sections 114 are unsown sections 116 which forms channels allowing the movement of the small beads 104 and the large beads 106 to allow the small beads 104 and the large beads 106 to be positioned on the bottom base 102. The top sheet 110 and the bottom sheet 118 may be two separate sheets or may be a single sheet folded over. The sown sections 114 and the unsown sections 116 may cooperate to form a raised area or loft 120. Instead of threads to form the sown sections 114, internal battles may be employed. FIG. 3 illustrates six vertical middle chambers that connect a top and bottom horizontal chamber. The chambers allow the beads 104, 106 to be distributed in response to pressure applied by the user. FIG. 3 shows a larger amount of support and loft 120 in the front chambers and a lesser amount of support and loft in the middle and bottom chambers. When filled with a mix of beads, the chambers generally resemble the shape of a plurality of baseball bats lined up together vertically side by side.

Figure 4:
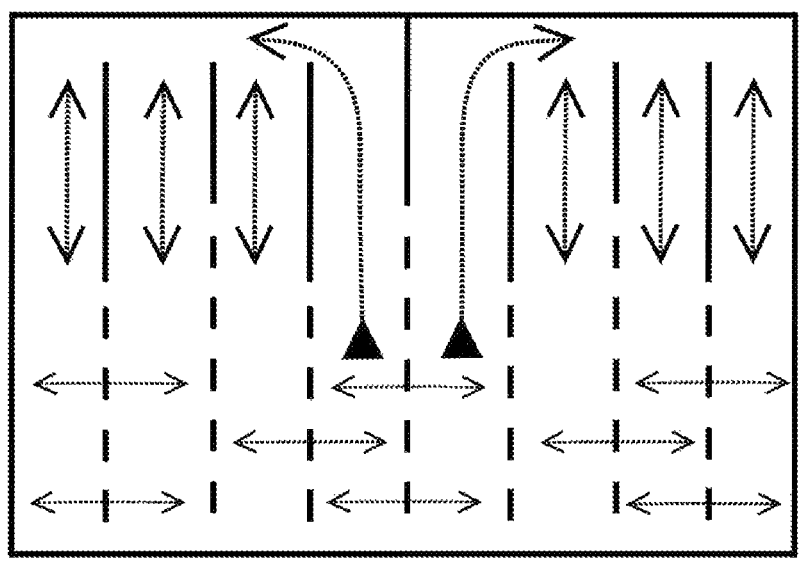
FIG. 4 illustrates the flow of the beads of the pillow of the present invention.

FIG. 4 shows the possible flow of the smaller beads 104 and the larger beads 106 by the arrows. The large sown sections 114 restrict the movement of the beads 104, 106 to essentially the horizontal direction while the smaller intermittent sown sections 104, which may have slack within the threads within the bead container 108, allow controlled movement in the vertical direction. Internal baffles could be used.

Figure 5:
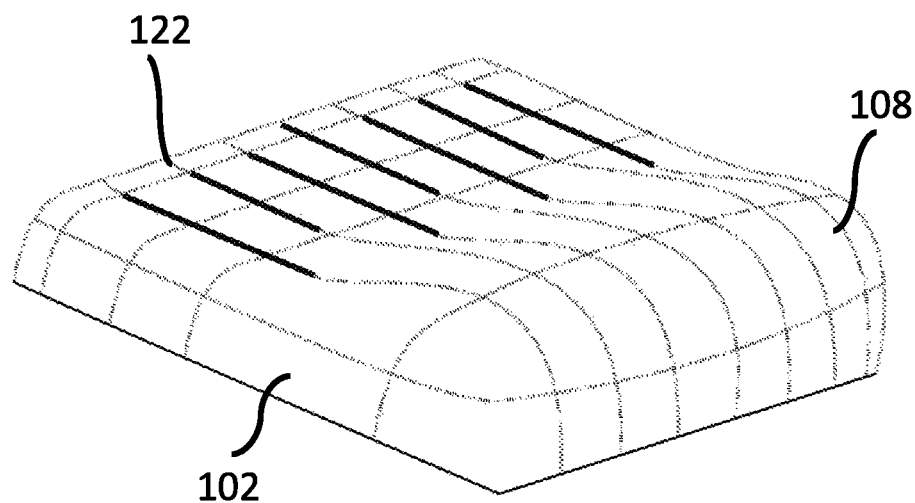
FIG. 5 illustrates the top layer of the pillow of the present invention.

FIG. 5 shows the bottom base 102 and the bead container 108 being positioned within a cavity of an outer covering 122 which may be formed of a less elastic material than the material used to form the bead container 108 and/or the bottom base 102. The outer cover may contain multiple types of backing that vary in elasticity and stretch characteristics arranged in zones to allow some areas of the outer cover to be more elastic and give in more than other areas in response to the user. The outer covering 122 may include a zipper for access to the cavity.

Figure 6:
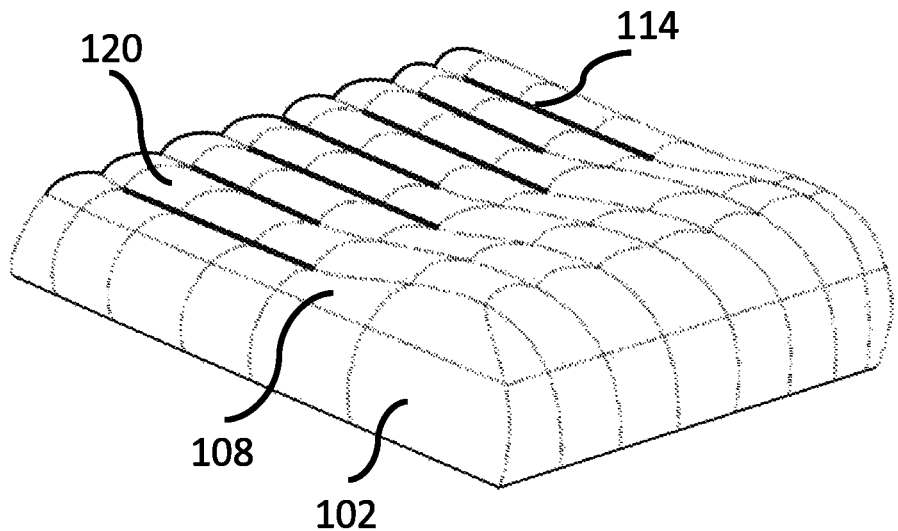
FIG. 6 illustrates a perspective view of the pillow of the present invention.

FIG. 6 illustrates the bottom base positioned beneath the bead container 108. When the user applies pressure to one of the larger channels, the beads 104, 106 are distributed more evenly to other channels. The puffing of the loft 120 is directly affected by the distribution of the sown sections 114. The mix of the small beads 104 and the large beads 106 affects the distribution within the bead container 108. The volume of beads and a ratio of the mix affect the firmness of the pillow 100 as well as the density of the foam of the bottom base 102. The ratio of large beads 106 to small beads 104 result in the performance of the pillow.

Figure 7:
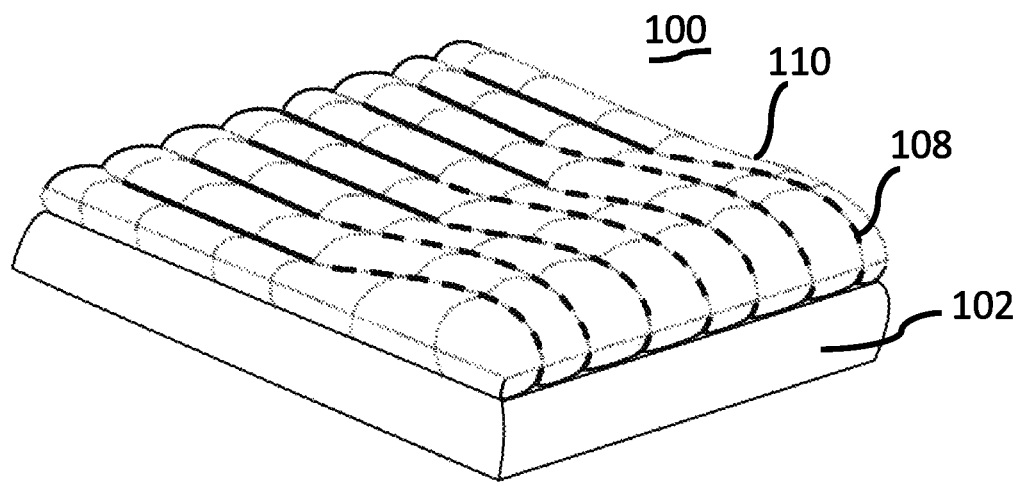
FIG. 7 illustrates a perspective view of the pillow of the present invention.

FIG. 7 illustrates a perspective view of the pillow 100 without a cover and the bead container 108 overlaps the bottom base 102. The pillow 100 includes the sown sections 114 which limit the loft and the amount of beads 104, 106 that can be distributed. The top sheet 110 and the bottom sheet 118 may be attached to the bottom base 102 being sown in solid lines or at intermittent points along the right and left edges as well as the back edge. Buttons, Velcro and other fasteners may be used to attach the top sheet 110 and the bottom sheet 118 to the bottom base 102.

The front edge of the bead container 108 may not be sown to the bottom base 102 to enhance the loft and movement of the beads 104, 106 within the bead container 108.

Figure 8:
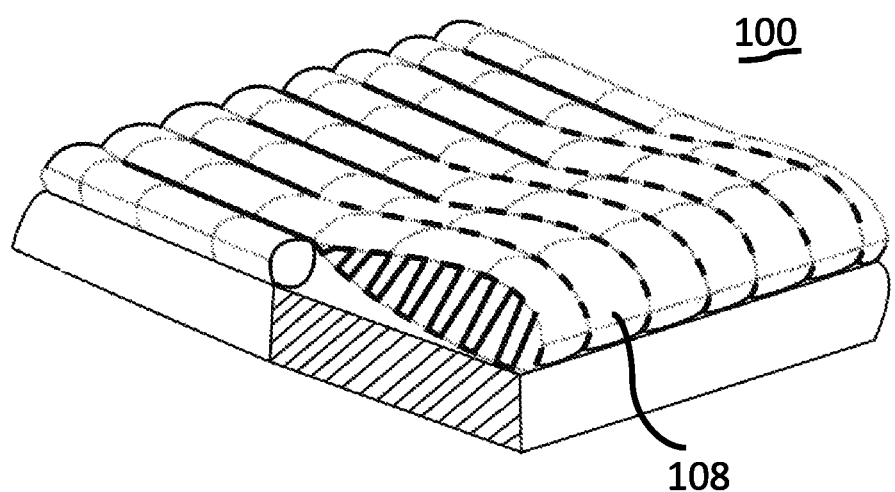
FIG. 8 illustrates a perspective view of a section of the pillow of the present invention.

FIG. 8 illustrates a sectional view of the pillow 100 showing the sown sections 114 with slack in the threads forming an internal barrier reducing the horizontal movement of the beads 104, 106 within the bead container 108.

Figure 9:
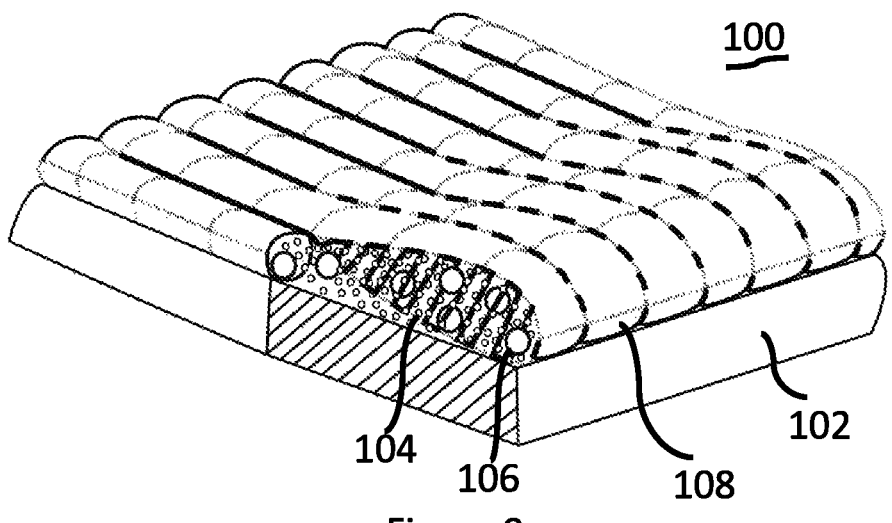
FIG. 9 illustrates a perspective view of a section of the pillow of the present invention.

FIG. 9 illustrates another sectional view of the pillow 100 showing the sown sections 114 limiting the movement of the beads 104, 106. The structure makes the pillow 100 more effective for side sleepers by preventing the beads 104, 106 from excessive movement horizontally.

The mid chambers allow communication between the larger front chamber to the smaller back chambers. The large beads 106 promote travel and bulk particularly in the smaller mid and back chambers.

The larger beads 106 allow the smaller beads 104 to travel and to prevent the small beads 104 from packing like sand under the user. The bottom base 102 provides a relatively flat travel surface to allow communication of the beads 104, 106 between the chambers.

Figure 10:
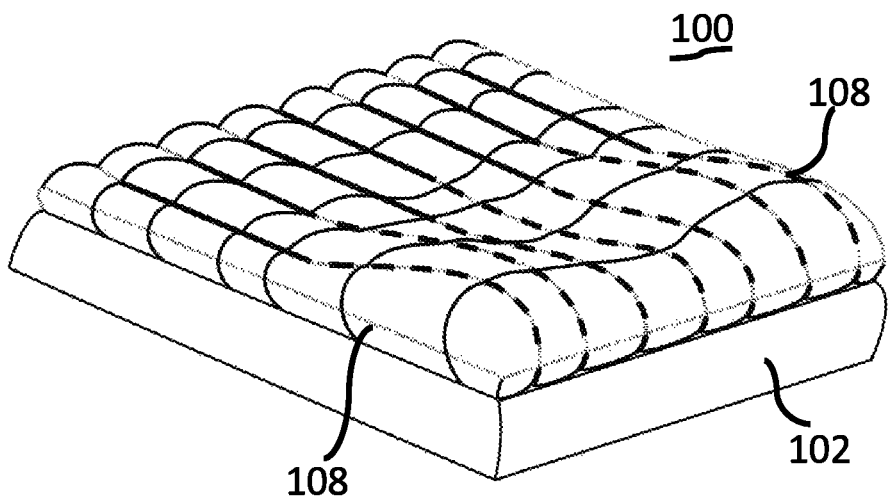
FIG. 10 illustrates a perspective view of the pillow of the present invention.

FIG. 10 illustrates the mix of beads 104, 106 that are responsive to the user. The shape of the neck and head are depressed within the bead container 108. The result is adaptable support from the top of the bead container 108 of the mix of beads 104, 106 and more resilient support underneath from the bottom base 102. Having the mid chambers that run from front to back of the pillow allows these chambers to fill and empty readily in response to the user's head. The beads rebound from the smaller back chamber to recirculate through the mid chambers and the larger front chamber. The centerline enhances the circulation of beads 104, 106 and helps ensure that the front chamber is not empty as the user changes position while sleeping. The mid and back chambers also prevent the middle and back of the pillow 100 from puffing up with too high of loft in response to the distribution of the beads 104, 106. This prevents the pillow 100 from putting uncomfortable pressure on the back of the user head or tilting the user's head upward excessively from the back of the pillow 100.

Figure 11:
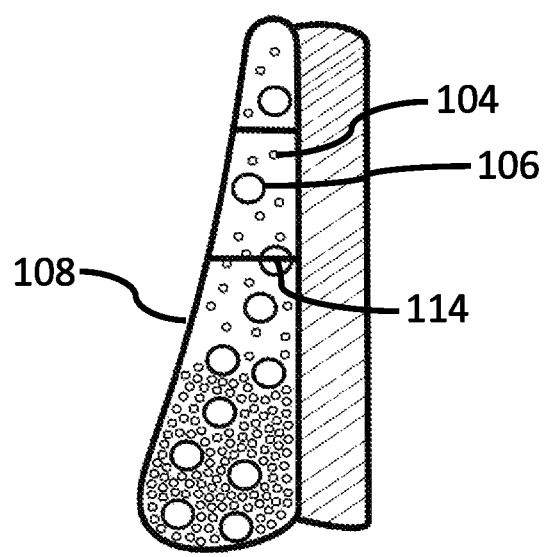
FIG. 11 illustrates a cross-sectional view of the pillow of the present invention.

FIG. 11 illustrates a cross-sectional view of the pillow 100 and illustrates the bottom base 102, the small beads 104, the large beads 106, the sown sections 114 and the unsown sections 116 with the larger front chamber facing downward. The pillow 100 can re fluff the bead container 108 by holding the pillow 100 with the larger front chamber in a downward position. The beads 104, 106 flow from the back and mid chambers to the larger front chamber to reset. This puts the pillow 100 in the state where the mid and back chambers are substantially flat and empty with the larger front chamber bulging with the pool of beads 104, 106. The user can then redistribute the beads 104, 106 as required for comfort and use.

Figure 12:
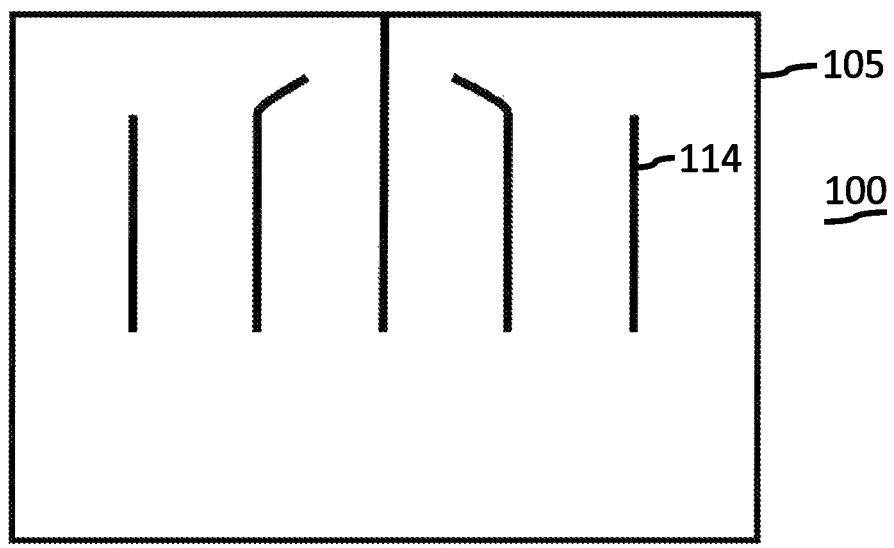
FIG. 12 illustrates an additional embodiment of the pillow of the present invention.

FIG. 12 illustrates another embodiment of the pillow 100 which may not have the intermittent sown sections 114, leaving the front of the bead container 108 restricted with respect to loft and movement of the beads 104, 106.

Figure 13:
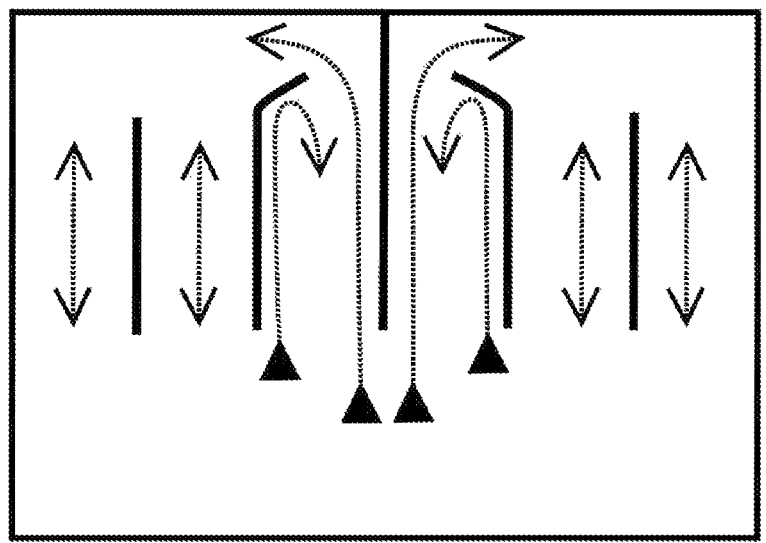
FIG. 13 illustrates a top view of the pillow of the present invention.

FIG. 13 illustrates a flow diagram of the beads 104, 106 in the embodiment of FIG. 12. The center sown section 114 extends to the back edge with adjacent sown lines 114 being hockey stick shaped which limits the flow of the beads 104, 106 and the center sown section 114 divides the travel of the beads 104, 106 along the back edge of the bead container 108 which forces the beads 104, 108 to circulate right or left. The beads 104, 106 may pool too much along the back edge, leaving the larger front chamber excessively empty and constantly being in need of adjustment by the user as the user moves between different sleeping positions. The embodiment additionally makes the pillow 100 suitable for back and side sleeping positions.

Figure 14:
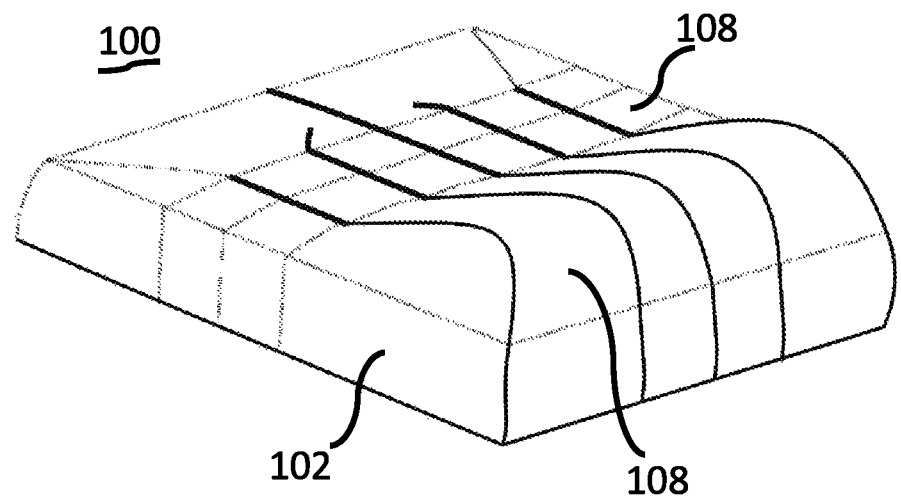
FIG. 14 illustrates another embodiment of the pillow of the present invention.

FIG. 14 illustrates another embodiment of the pillow 100 of the present invention and illustrates that when the bead container 108 is filled with beads 104, 106. In the initial state, a majority of the beads 104, 106 pool in the larger front chamber leaving the smaller mid and back chambers mostly flat and empty. In this embodiment, the bead container 108 overlaps with the bottom base 102.

Figure 15:
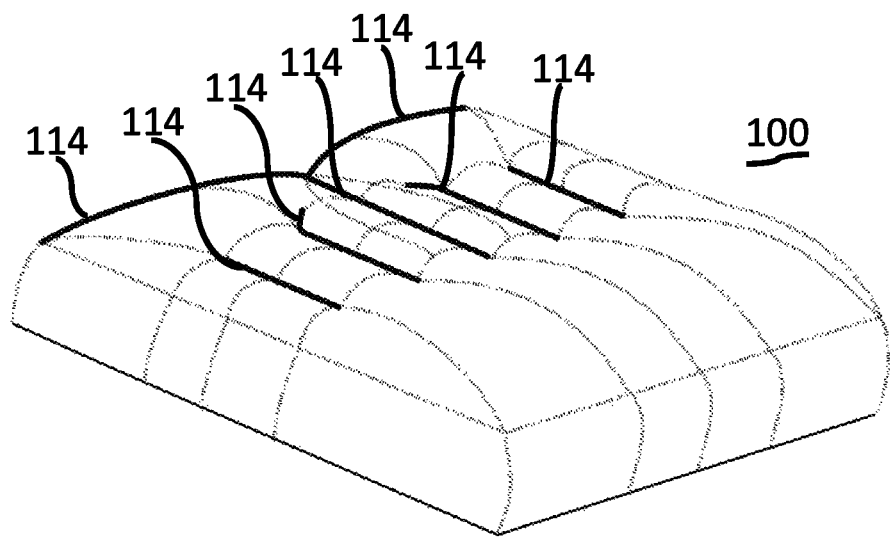
FIG. 15 illustrates another embodiment of the pillow of the present invention.

FIG. 15 illustrates another embodiment of the pillow 100 of the present invention and illustrates a centerline sown section 114 and a pair of opposing hockey stick sown sections 114 to create a book shape by the sown section 114 along the back edge. This design effectively reduces the amount of fill and pressure along the back of the user's head.

Figure 16:
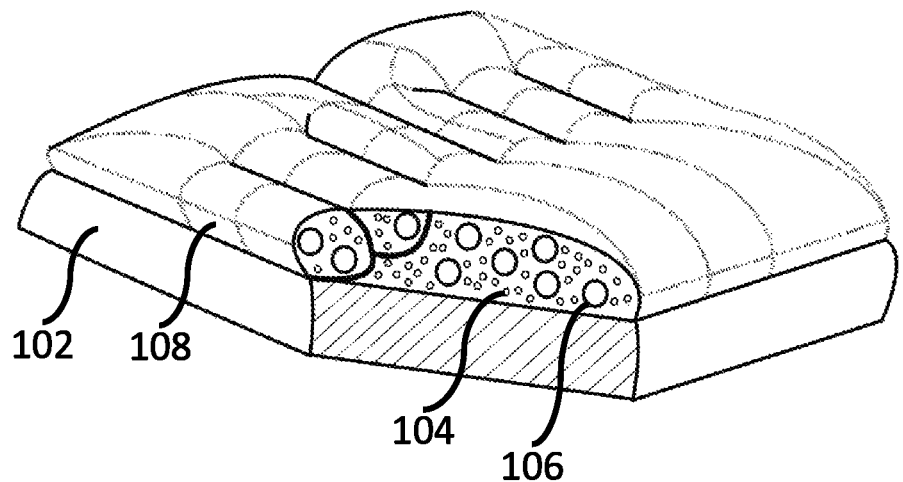
FIG. 16 illustrates a sectional view of the pillow of the present invention.

FIG. 16 illustrates a sectional view of the embodiment of FIG. 15. FIG. 16 illustrates a large front channel and six mid chambers that control the travel of beads 104, 106. The beads 104, 106 are less restricted to move horizontally in the front chamber.

Figure 17:
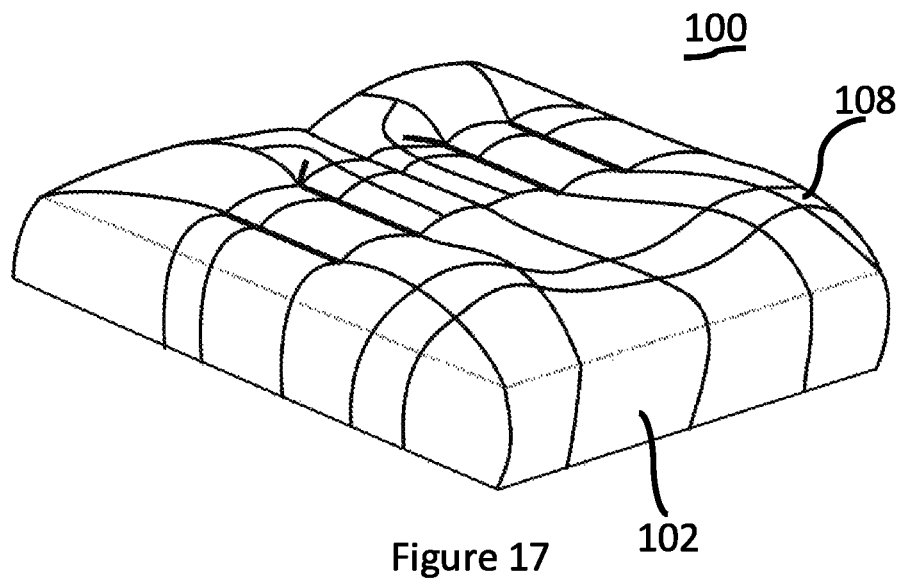
FIG. 17 illustrates a perspective view of the pillow of the present invention.

FIG. 17 illustrates a perspective view of the embodiment of FIG. 15, and the centerline and nozzle formation enhance the circulation of the beads 104, 106 and prevents the front chamber from emptying as the user changes position while sleeping.

The mid and back chambers also prevent the middle and back of the pillow 100 from pumping up with too high of a loft in response to the distribution of the beads 104, 106.

Figure 18:
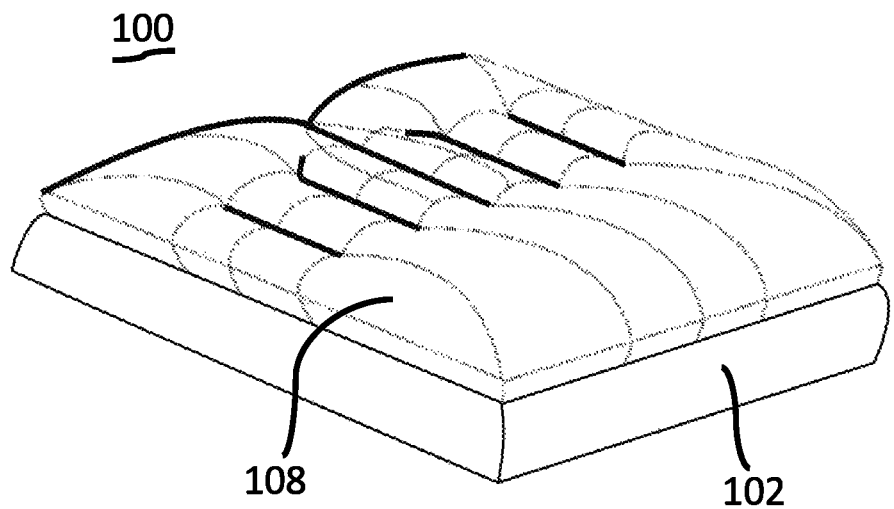
FIG. 18 illustrates a perspective view of the pillow of the present invention.

FIG. 18 illustrates a perspective view of the pillow 100 of the embodiment of FIG. 15 and illustrates that the bead container 108 is attached to the top of the bottom base 102.

Figure 19:
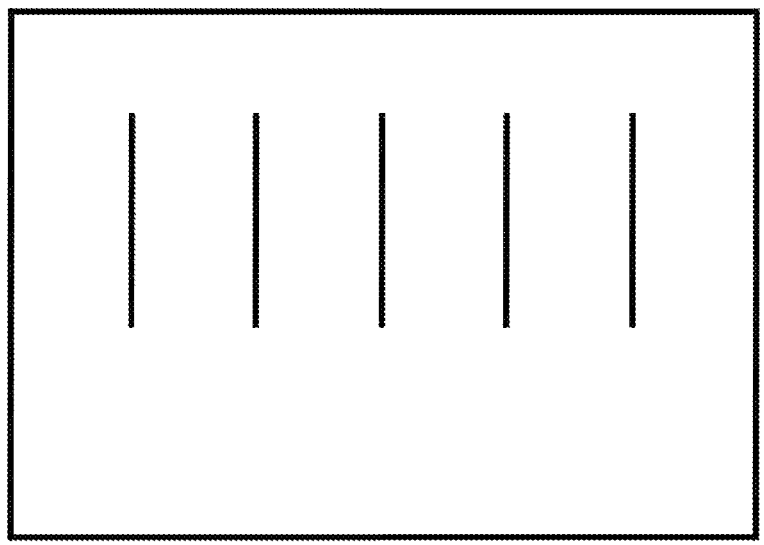
FIG. 19 illustrates a top view of the pillow of the present invention.

FIG. 19 illustrates another embodiment of the pillow 100 of the present invention and illustrates the bead container 108 without the center line sown section 114 and without the hockey stick sown section 114.

Figure 20:
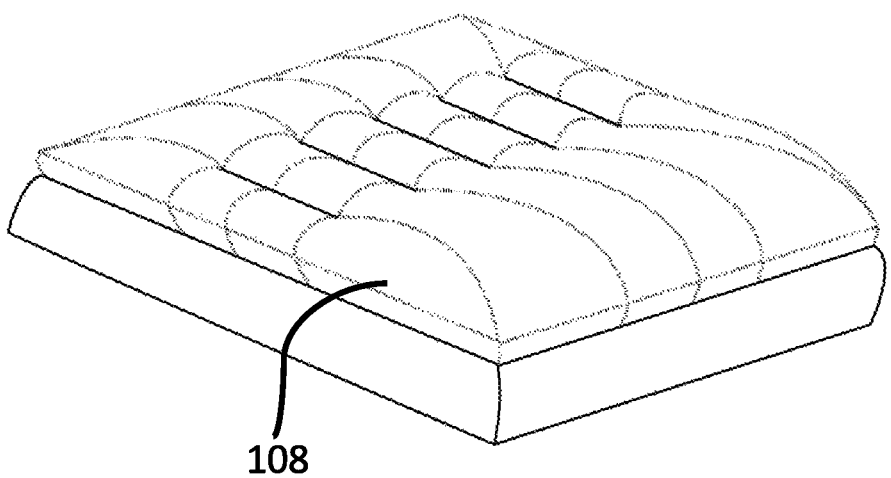
FIG. 20 illustrates a perspective view of the pillow of the present invention.

FIG. 20 illustrates the embodiment of FIG. 19 when the pillow 100 is puffed up with the bead mix 104, 106 distributed throughout the bead container 108. This embodiment shows an even back profile without the open book shape.

Figure 21:
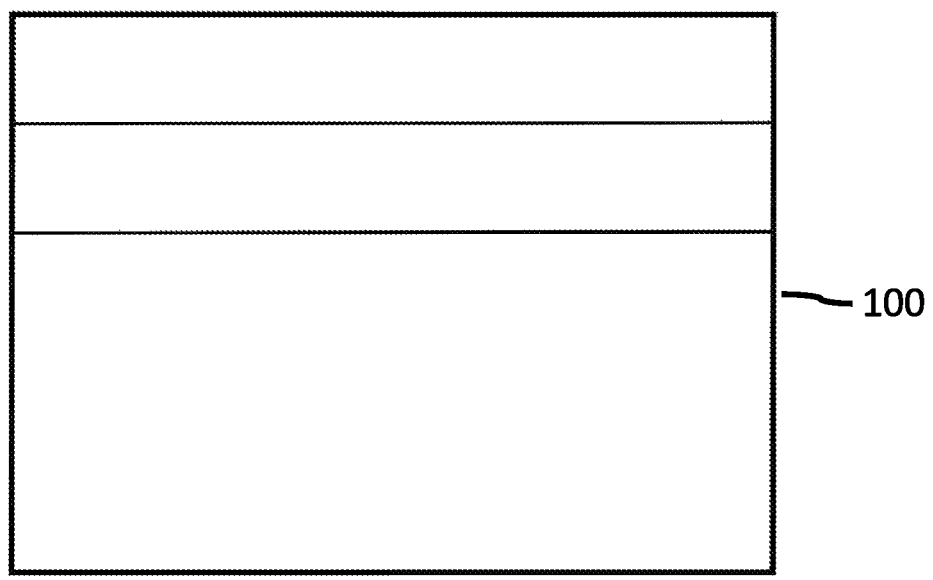
FIG. 21 illustrates a top view of the pillow of the present invention.

FIG. 21 illustrates another embodiment of the pillow 100 and illustrates a multitude of parallel chambers which may be independently sealed from one another or open for communication between the chambers. With the chambers sealed with respect to each other, the result is more compression within the larger front chamber and the beads 104, 106 have less room to travel. The larger front chamber may include a mix of beads 104, 106 while the smaller back chambers may include only beads 104 allowing the larger front chamber to be bulkier and higher in loft while the back chambers are less bulky and restricted in loft.

Figure 22:
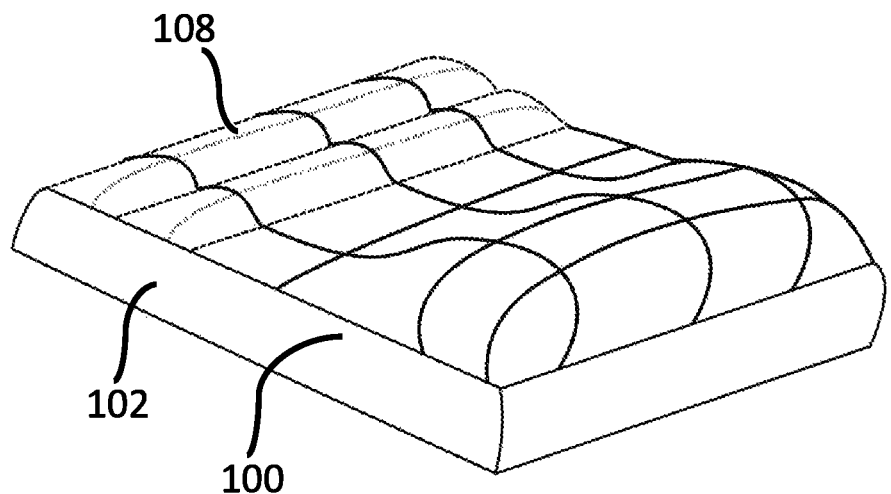
FIG. 22 illustrates a perspective view of the pillow of the present invention.

FIG. 22 illustrates another embodiment of the pillow 100 when the bead container 108 is filled with beads 104, 106 and attached to the bottom base 102. The majority of the beads 104, 106 are positioned within the larger front chamber near the leading front edge with the back portion of the large front chamber being mostly flat and empty. Since the rear chambers are shown in this embodiment, the volume of beads within these rear chambers remains consistent.

Figure 23:
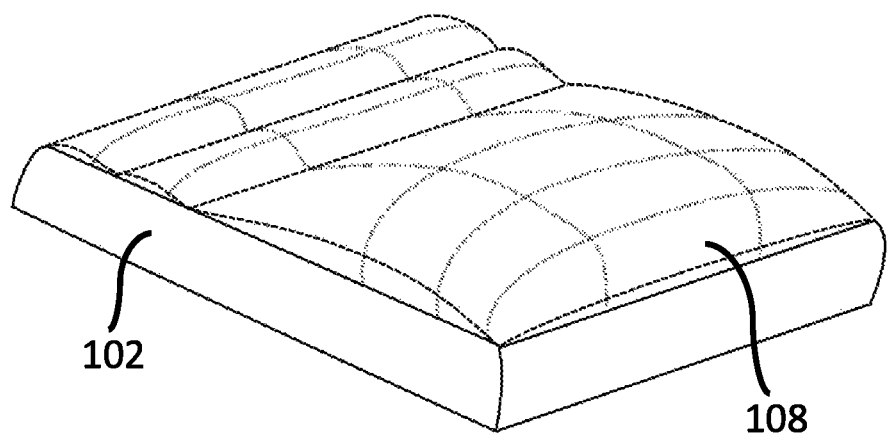
FIG. 23 illustrates a perspective view of the pillow of the present invention.

FIG. 23 illustrates another embodiment of the pillow 100 with the three parallel chambers attached to the bottom base 102. The larger front chamber provides most of the support to the user while the smaller back chambers provide cushioning but not a lot of bulk around the back of the user's head. The advantage of this design is the larger front chamber provides more adaptable arched support for the user's head. If the user has a short neck, the user's head will not extend to the larger front chamber resulting in the head being pushed up too much. A way to counter this effect is to put a lower overall volume of the beads 104, 106 in the larger front chamber.

Figure 24:
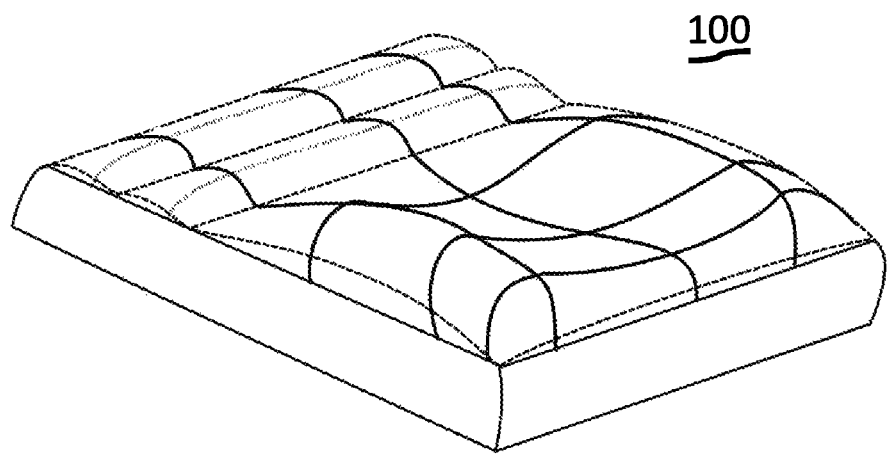
FIG. 24 illustrates a perspective view of the pillow of the present invention.

FIG. 24 illustrates a perspective view of the pillow 100 of the present invention and illustrates the mix of beads 104, 106 being distributed from side to side within the larger front chamber in response to pressure from the user and preferably does not communicate with the smaller back chambers (the beads 104, 106 remain in the large chamber). The mix of beads 104, 106 within the larger front chamber prevents the beads 104, 106 from packing under the user and promotes bulk and movement in the right areas. The smaller back chambers preferably only contained the small beads 104 as opposed to the large beads 106 not requiring as much bulk or movement in the back of this pillow 100.

Figure 25:
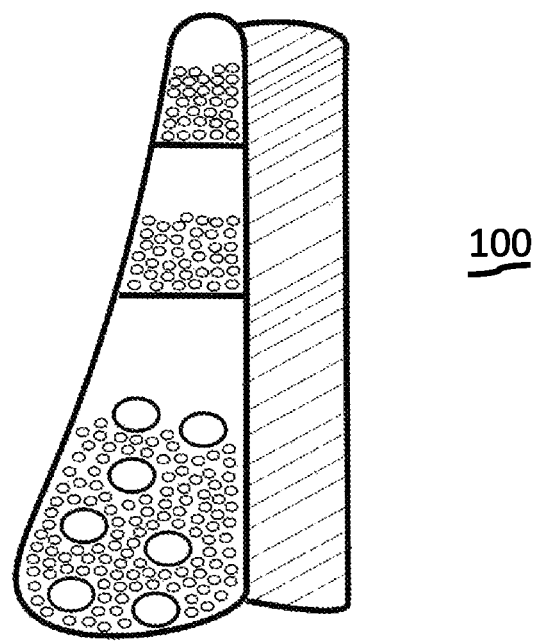
FIG. 25 illustrates a cross-sectional view of the pillow of the present invention.

FIG. 25 illustrates a cross-section of the pillow 100 of the present invention showing the larger front chamber facing downward allowing all the chambers to be reset to the initial position by holding the pillow 100 vertically. The smaller back chambers having the small beads 104 do not communicate with the beads 104, 106 in the larger front chamber.

Figure 26:
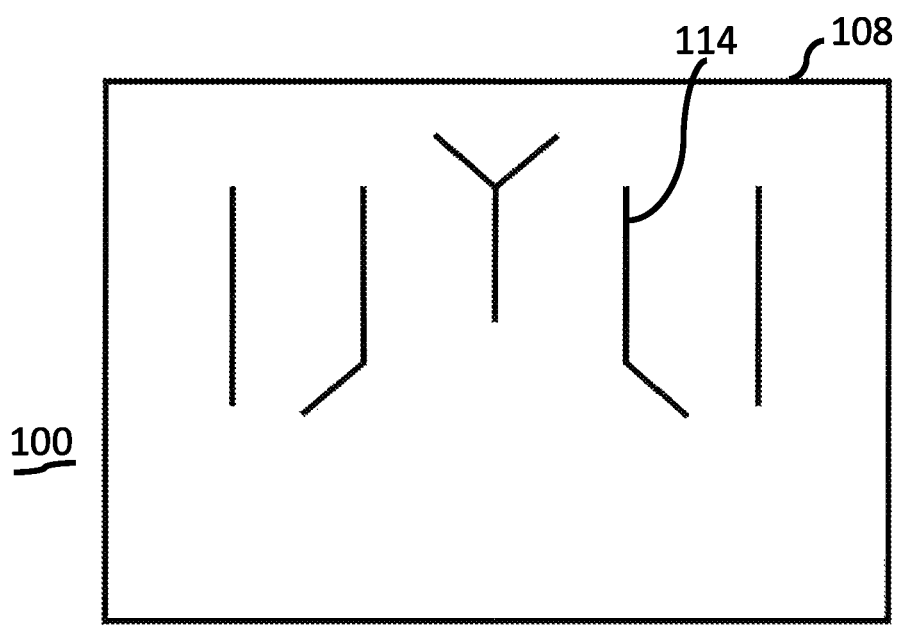
FIG. 26 illustrates a top view of the pillow of the present invention.

FIG. 26 illustrates a top view of the pillow 100 of the present invention and illustrates a different pattern that could be sewn into the bead container 108 to provide a different distribution of the mix of beads 104, 106. This pattern would allow the larger front chamber to extend further to the back of the pillow 100 with an arched formation in the middle. This pattern also has a nozzle feature near the large front chamber to hold beads 104, 106 around the user head in a different structure.

Figure 27:
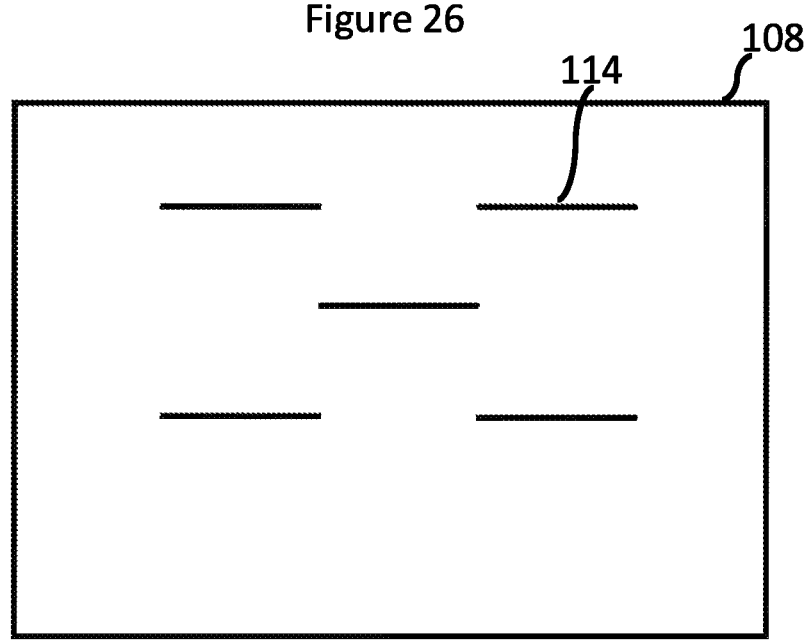
FIG. 27 illustrates a top view of the pillow of the present invention.

FIG. 27 illustrates a different embodiment of the pillow 100 and illustrates an additional pattern that could be sewn into the bead container 108 to provide a different distribution of beads 104, 106.

Figure 28:
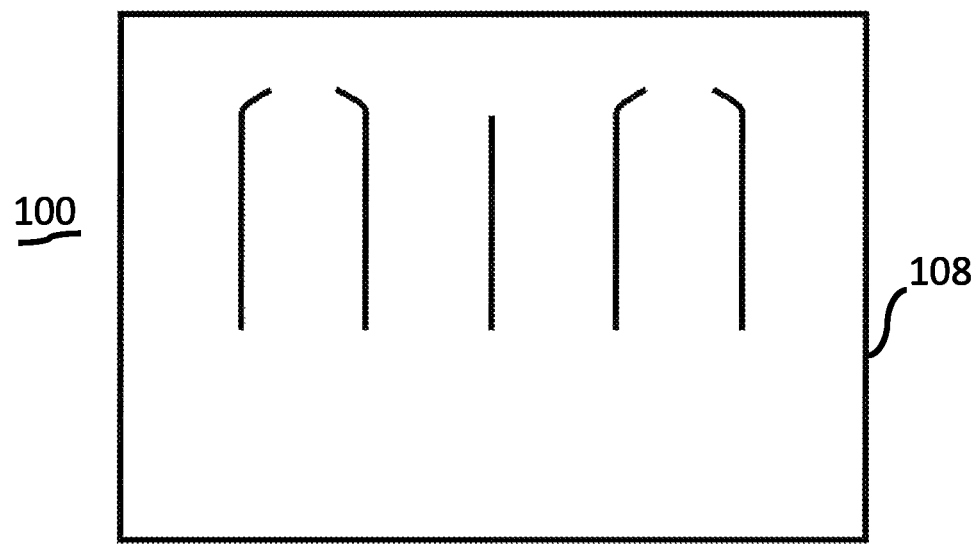
FIG. 28 illustrates another embodiment of the present invention.

FIG. 28 illustrates another embodiment of the pillow 100 and illustrates the top surface of the bead container 108. FIG. 28 illustrates the pattern using more than one nozzle formation without the being sewn all the way to the back edge.

Figure 29:
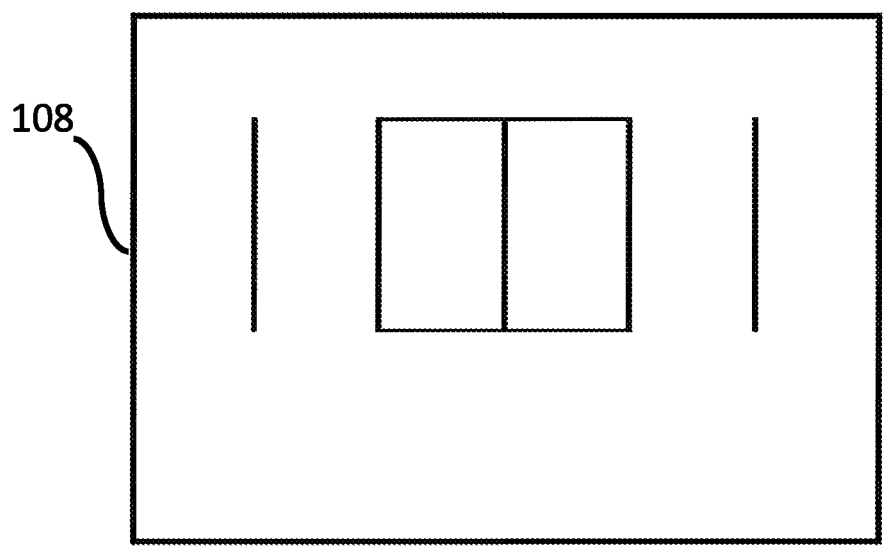
FIG. 29 illustrates another embodiment of the present invention.

FIG. 29 illustrates the top surface of the bead container 108 and illustrates a pattern that could be sewn into the bead container 108 where one or more of the middle chambers are closed off and filled with small beads 104. This creates one or more self-contained zones in the middle which would force the mix of beads 104, 106 and the remaining chambers to flow around the chambers that are closed off from the surrounding chambers.

The invention claimed is:

1. A pillow for a user, comprising:
 a bottom base to support the pillow;
 a bead container connected to the bottom base including a mix of beads;
 wherein the bead container includes a sewn section and an un-sown section to define a channel to control the movement of the beads;
 wherein the pillow includes an outer cover including a plurality of material layers including a first and second material layer cooperatively defining a first and second section, the first section substantially more elastic in respect to the second section to control support to the user.

2. A pillow for a user as in claim 1, wherein the sewn section and the un-sown section form a plurality of vertical middle channels connecting a small rear chamber and a large front chamber.

3. A pillow for a user as in claim 1, wherein the sewn section includes one or more of, lose internal threads, and porous baffles to allow loft and less restricted movement of the mix of beads within one or more predetermined areas.

4. A pillow for a user as in claim 1, wherein the first material layer is substantially elastic and the second material layer is substantially non-elastic.

5. A pillow for a user as in claim 4, wherein the second material layer is exhibiting a first area that has a cutout void and a second area that is continuous such that the first material layer is capable of stretching into the cutout void of the first area and substantially prevented from stretching into the second area that is continuous.

6. A pillow for a user as in claim 5, wherein the outer cover includes a first periphery having a right, left, center, front and rear region wherein the first area of the second material layer is extending across the center region defining the first section of the outer cover and the second area of the second material layer is extending across the right, left, front and rear region defining the second section of the outer cover such that the first material layer is capable of stretching into the first area of the second material layer and substantially prevented from stretching into the second area of the second material layer.

7. A pillow for a user as in claim 6, wherein the plurality of material layers includes a third material layer that is elastic wherein the third material layer is overlapping the cutout void of the first area of the second material layer for controlling elastic tension of the first material layer.

8. A pillow for a user as in claim 1, wherein the plurality of material layers is connected in a recurring pattern across a periphery for limiting separation of the material layers and controlling elasticity of the first section of the outer cover.

9. A pillow for a user, comprising:
 a pillow case including a distinct volume of compressible resilient particles capable of traveling within the pillow case;
 the pillow case connected to a substantially solid compressible resilient bottom base including a predetermined travel surface for the distinct volume of compressible resilient particles to travel over;
 wherein the pillow includes an outer cover including an elastic layer and a plurality of backing materials including a first and second backing material, the elastic layer and the first and second backing material cooperatively defining a first and second section of the outer cover, the first section substantially more elastic than the second section.

10. A pillow for a user as in claim 9, wherein the pillow case includes one or more of, sewn sections, un-sown sections, and internal baffles to control movement of the distinct volume of compressible resilient particles.

11. A pillow for a user as in claim 9, wherein the first backing material is substantially elastic and the second backing material is substantially non-elastic.

12. A pillow for a user as in claim 11, wherein the second backing material is exhibiting a first area that is discontinuous with an open void and a second area that is continuous wherein the first backing material is spanning the open void for controlling elastic tension of the elastic layer such that the elastic layer is capable of stretching into the open void of the first area and substantially prevented from stretching into the second area that is continuous.

13. A pillow for a user as in claim 12, wherein the outer cover includes a first surface having a peripheral region generally surrounding an inner region wherein the first area of the second backing material including the open void is extending across the inner region defining the first section of the outer cover that is elastic and the second area of the second backing material that is continuous is extending across the peripheral region defining the second section of the outer cover that is non-elastic such that the elastic layer is capable of stretching into the first backing material at the inner region of the first surface and substantially prevented from stretching into the peripheral region of the first surface.

14. A pillow for a user as in claim 9, wherein the elastic layer and the plurality of backing materials are connected in a recurring pattern across a periphery for limiting separation of the elastic layer and the plurality of backing materials and controlling elasticity of the first section of the outer cover.

15. A pillow for a user comprising:
a sack enclosing a volume of lose fill particles capable of traveling within the sack;
the sack defining a plurality of chambers aligned vertically in a parallel arrangement to one another to control movement of the volume of lose fill particles;
wherein the plurality of chambers being capable of communicating with one another;
wherein the sack being in an overlapping arrangement with a support base;
wherein the pillow includes an outer cover including an exterior layer and an inner lining, the exterior layer including a stretch fabric, the exterior layer and the inner lining cooperatively defining a first and second section of the outer cover, the first section stretch and the second section substantially non-stretch to control support to the user.

16. A pillow for a user as in claim 15, wherein the exterior layer and the inner lining are connected in a recurring pattern across a periphery for limiting separation of the exterior layer and inner lining and controlling elasticity of the first section of the outer cover.

17. A pillow for a user as in claim 15, wherein the plurality of chambers is formed by one or more of, sewn sections, un-sown sections, and internal baffles.

18. A pillow for a user as in claim 15, wherein the inner lining includes a first area that is stretch material and a second area that is non-stretch material.

19. A pillow for a user as in claim 18, wherein the inner lining includes a first surface having an outlying region generally surrounding an interior region wherein the first area of the inner lining is extending across the interior region defining the first section of the outer cover that is stretch, and the second area of the inner lining is extending across the outlying region defining the second section of the outer cover, which is non-stretch, such that the stretch fabric of the exterior layer is capable of stretching into the first area of the inner lining and substantially prevented from stretching into the second area of the inner lining.

20. A pillow for a user as in claim 19, wherein the second area of the inner lining at the outlying region of the first surface defines a first plurality of outer perimeters and a first plurality of inner perimeters of the outlying region wherein the first plurality of outer perimeters and the first plurality of inner perimeters are connected by a first continuous middle wherein the first area of the inner lining at the inner region defines a second plurality of outer perimeters spanned by a second continuous middle wherein the second outer plurality of outer perimeters of the first area is connected to the first plurality of inner perimeters of the second area such that the inner region is capable of stretching and the outlying region is capable of substantially maintaining non-elasticity under tension for stabilizing elasticity of the inner region and the first area of the inner lining and the stretch fabric of the exterior layer.

* * * * *